(12) United States Patent
Galambos et al.

(10) Patent No.: US 7,211,779 B2
(45) Date of Patent: May 1, 2007

(54) PIXEL SENSOR WITH CHARGE EVACUATION ELEMENT AND SYSTEMS AND METHODS FOR USING SUCH

(75) Inventors: Tiberiu C. Galambos, Biniamina (IL); Yair Elmakias, Migdal Haemek (IL)

(73) Assignee: TransChip, Inc., Ramat-Gan (IL)

( * ) Notice: Subject to any disclaimer, the term of this patent is extended or adjusted under 35 U.S.C. 154(b) by 0 days.

(21) Appl. No.: 10/485,707

(22) PCT Filed: May 29, 2002

(86) PCT No.: PCT/US02/17357

§ 371 (c)(1),
(2), (4) Date: Aug. 10, 2004

(87) PCT Pub. No.: WO03/017369

PCT Pub. Date: Feb. 27, 2003

(65) Prior Publication Data

US 2005/0023436 A1   Feb. 3, 2005

Related U.S. Application Data

(60) Provisional application No. 60/312,622, filed on Aug. 14, 2001.

(51) Int. Cl.
*H04N 5/335* (2006.01)
(52) U.S. Cl. .................. 250/208.1; 250/214.1; 348/308
(58) Field of Classification Search .......... 250/208.1, 250/214.1, 214 C; 257/229, 288, 291, 292, 257/298, 296, 373–376; 348/302, 303, 308; 438/57
See application file for complete search history.

(56) References Cited

U.S. PATENT DOCUMENTS

| 5,436,476 | A  | * | 7/1995 | Hynecek ............... 257/223 |
| 5,900,623 | A  | * | 5/1999 | Tsang et al. .......... 250/208.1 |
| 6,046,444 | A  | * | 4/2000 | Afghahi .............. 250/208.1 |
| 6,243,434 | B1 | * | 6/2001 | Hynecek ................ 377/60 |
| 6,350,663 | B1 | * | 2/2002 | Kopley et al. .......... 438/448 |
| 6,730,969 | B1 | * | 5/2004 | Padmanabhan et al. ... 257/356 |
| 2005/0128325 | A1 | * | 6/2005 | Fraenkel et al. ........ 348/308 |

OTHER PUBLICATIONS

Tian et al., "*Analysis of Temporal Noise in CMOS Photodiode Active Pixel Sensor*" IEEE Journal of Solid State Circuits, vol. 36, No. 1, Jan. 2001.

Fossum, "*CMOS Image Sensors: Electronic Camera-On-A-Chip*" IEEE Transactions on Electronic Devices, vol. 44, No. 10, Oct. 1997.

* cited by examiner

*Primary Examiner*—Stephone B. Allen
(74) *Attorney, Agent, or Firm*—Townsend and Townsend and Crew LLP

(57) ABSTRACT

The pixel includes a reset element (350) used in relation to charging a light sensitive element (390). Further, the pixel includes a charge evacuation element (380) for dissipating charge build up about the reset element. Dissipation of the charge results in a reduction of noise at the output of the pixel.

28 Claims, 7 Drawing Sheets

PIXEL SENSOR WITH CHARGE EVACUATION ELEMENT AND SYSTEMS AND METHODS FOR USING SUCH

CROSS-REFERENCE TO RELATED APPLICATION

This application claims the benefit of U.S. Provisional Patent Application No. 60/312,622, filed on Aug. 14, 2001, which is incorporated by reference herein in its entirety.

BACKGROUND OF THE INVENTION

The present invention relates generally to systems and methods for image acquisition, and in particular to systems, methods, and devices for reducing noise in pixels used in image acquisition.

FIG. 1 illustrates a conventional metal oxide semiconductor ("MOS") pixel 100. As illustrated, pixel 100 includes a reset transistor 110 connected to photodiode 150, a source follower transistor 130, and an access transistor 140. During reset of pixel 100, a reset signal 160 associated with a pixel (i) is asserted high such that the rail voltage associated with conventional pixel 100 is applied to the gate of reset transistor 110. Prior to application of reset signal 160, reset transistor 110 is cut off.

Upon assertion of reset signal 160, reset transistor 110 provides a low impedance path between a node 191 and a node 151. This low impedance path causes a reverse bias on photodiode 150, where the voltage at node 191 is greater than a common ground 193. This results in a charge build-up, and corresponding voltage at node 151 that remains after reset signal 160 is deasserted and node 151 is isolated from node 191. When incident light 194 falls upon photodiode 150, the voltage at node 151 begins to decay at a rate defined by the photocurrent through photodiode 150, that corresponds to the amount of incident light 194 impinging upon photodiode 150. Thus, where a high incidence of light is detected, voltage at node 151 decays rapidly, and where only a low incidence of light is detected, voltage at node 151 decays slowly. The voltage at node 151 is tied to the gate of source follower transistor 130.

Source follower transistor 130 provides a signal at its source that is representative of the voltage at node 151. Further, when the incidence of light on photodiode 150 is to be read, a select signal 180 is asserted high, thus providing a low impedance path from node 141 to a bit sense node 170. Thus, where a sufficient amount of incident light 194 impinges upon photodiode 150, bit sense node 170 will exhibit a low voltage, otherwise, bit sense 170 will exhibit a voltage corresponding to the voltage at node 151.

Various problems associated with such MOS pixels are discussed in "Analysis of Temporal Noise in CMOS Photodiode Active Pixel Sensor" by Tian et al., IEEE Journal of Solid State Circuits, Vol. 36, No. 1, January 2001. More particularly, Tian et al. disclose that MOS image sensors suffer from significant noise problems due to the design of such sensors. Such noise can be associated with operation of reset transistor, while other noise derives thermal and shot noise sources in pixel 100. Some approaches to control the various noise sources include operating reset transistor 110 in a subthreshold range, however, such approaches can result in image lag.

Alternatively, attempts have been made to reduce such noise by, for example, overdriving the gate of reset transistor 110 or by using a PMOS instead of an NMOS type transistor for reset transistor 110. However, such approaches can result is a dramatic increase in reset noise power. Such noise hampers the proper operation of such image sensors. Further, such noise can become more significant as the size of pixel 100 is reduced.

In some cases, off-chip digital signal processing has been employed to allow a sufficiently small pixel 100, while maintaining noise levels at acceptable level. In other cases, pixel 100 is simply comprised of relatively large devices that are less susceptible to noise constraints. Such an approach, however, is contrary to the industry need to constantly reduce pixel size. This industry need is highlighted in "CMOS Image Sensors: Electronic Camera-On-A-Chip" by Fossum, IEEE Transactions on Electronic Devices, Vol. 44, No. 10, October 1997. More particularly, Fossum points out the rapid trend toward reduced size pixels 100. This size reduction is particularly important where low powered devices are desired, such as in cellular telephone and other mobile applications. Thus, there exists a need in the art to provide a pixel that exhibits reduced noise characteristics and/or reduced size characteristics.

BRIEF SUMMARY OF THE INVENTION

Among other things, various aspects of the present invention relate to a pixel with a charge evacuation mechanism for reducing noise evident at the output of the pixel. In one aspect, the pixel includes a reset element used in relation to charging a light sensitive element. The evacuation mechanism is used to dissipate charge build up about the reset element. Dissipation of the charge results in a reduction of noise at the output of the pixel. In particular embodiments, such a pixel and/or charge evacuation mechanism is implemented using complementary metal oxide semiconductor ("CMOS"), field effect transistor ("FET") technology.

Further, aspects of the present invention include systems and methods for utilizing such pixels. More particularly, such methods include approaches for applying various control signals to the pixel and systems include elements for producing the various control signals.

One particular aspect of the invention provides a MOS pixel that includes a reset transistor with a reset source and a reset gate. Further, the pixel includes a charge evacuation element that is electrically coupled to the reset source and is operable to evacuate charge accumulated in a channel of the reset transistor. In some embodiments, the charge evacuation element is a MOS transistor with a charge evacuation drain, a charge evacuation source, and a charge evacuation gate. In particular cases, the charge evacuation source and the charge evacuation drain are both electrically coupled to the reset source. In various embodiments, the pixel further includes a light sensitive element electrically coupled to the reset source.

Further embodiments comprise a source follower transistor that includes a source follower gate and a source follower source, the source follower gate being electrically coupled to the reset source. Such embodiments further include a selection transistor with a selection drain, a selection source, and a selection gate, where the selection drain is electrically coupled to the source follower source. A selection signal is electrically coupled to the selection gate such that assertion thereof causes a representation of a signal from the node of the light sensitive element to be present on an output of the pixel.

In some embodiments, the charge evacuation element is a MOS transistor with a charge evacuation source and a charge evacuation drain, both of which are coupled to the reset source. The charge evacuation element further includes a charge evacuation gate. Further, such embodiments can include a reset signal driving the reset gate and a complement of the reset signal driving the charge evacuation gate. In some instances, the complement of the reset signal is delayed from the reset signal.

Other embodiments of the present invention provide a circuit including a reset transistor comprising a reset gate and a reset source. The circuit further includes a photodiode with a node of the photodiode electrically coupled to the reset source, and a charge evacuation transistor that includes a charge evacuation gate, a charge evacuation drain, and a charge evacuation source. The charge evacuation source and the charge evacuation drain are both electrically coupled to the reset source and the charge evacuation transistor is operable to evacuate charge accumulated in a channel of the reset transistor.

Various embodiments of the circuit also include a source follower transistor comprised of a source follower gate and a source follower source. The source follower gate is electrically coupled to the reset source. The circuit further includes a selection transistor comprised of a selection source, a selection gate, and a selection drain. The selection drain is electrically coupled to the source follower source. A selection signal is provided that when asserted causes a representation of a signal from the photodiode to be present on an output of the pixel.

Yet other embodiments of the present invention provide an imaging system. Such an imaging system includes a group of pixel elements. One or more of the pixel elements includes a reset element, a charge evacuation element, and a light sensitive element. In some cases, the imaging system further includes an optical device, wherein the optical device transfers light to the group of pixel elements, and wherein the light strikes the light sensitive element of the pixel elements. In addition, a timing circuit is included that provides at least one control signal to the group of pixel elements. In one particular instance, the group of pixel elements are arranged in a rectangular array.

Yet another embodiment of the present invention provides an image sensor including a plurality of pixel devices. The plurality of pixel devices are arranged as a plurality of rows and a plurality of columns. Each of the pixel devices includes: a light detecting element, and a charge evacuation element for dissipating unwanted charge built up in the image sensor.

Yet additional embodiments provide methods for detecting an image. Such methods include providing a pixel device that comprises a charge evacuation element, and applying a charge evacuation control signal to the charge evacuation element, wherein a charge accumulation in a channel of a reset transistor of the pixel device is reduced.

These and other aspects are more fully developed in the detailed description below. Thus, the summary provides only a general outline of the embodiments according to the present invention. Many other objects, features and advantages of the present invention will become more fully apparent from the following detailed description, the appended claims and the accompanying drawings.

BRIEF DESCRIPTION OF THE DRAWINGS

A further understanding of the nature and advantages of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Various aspects of the present invention relate to a pixel with a charge evacuation mechanism for reducing noise evident at the output of the pixel. In one aspect, the pixel includes a reset element used in relation to charging a light sensitive element. The evacuation mechanism is used to dissipate charge build up about the reset element. Dissipation of the charge results in a reduction of noise at the output of the pixel. In particular embodiments, such a pixel and/or charge evacuation mechanism is implemented using complementary metal oxide semiconductor ("CMOS"), field effect transistor ("FET") technology.

Further, aspects of the present invention include systems and methods for utilizing such pixels. More particularly, such methods include approaches for applying various control signals to the pixel and systems include elements for producing the various control signals.

Figure 1:
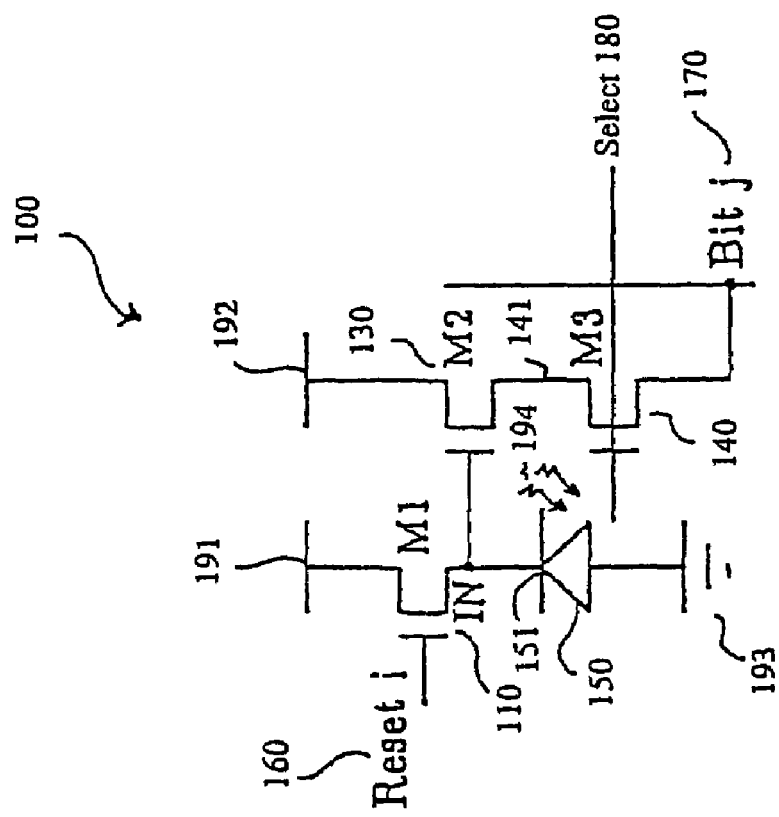
FIG. 1 is a schematic diagram of a three transistor pixel known in the art.
Figure 2:
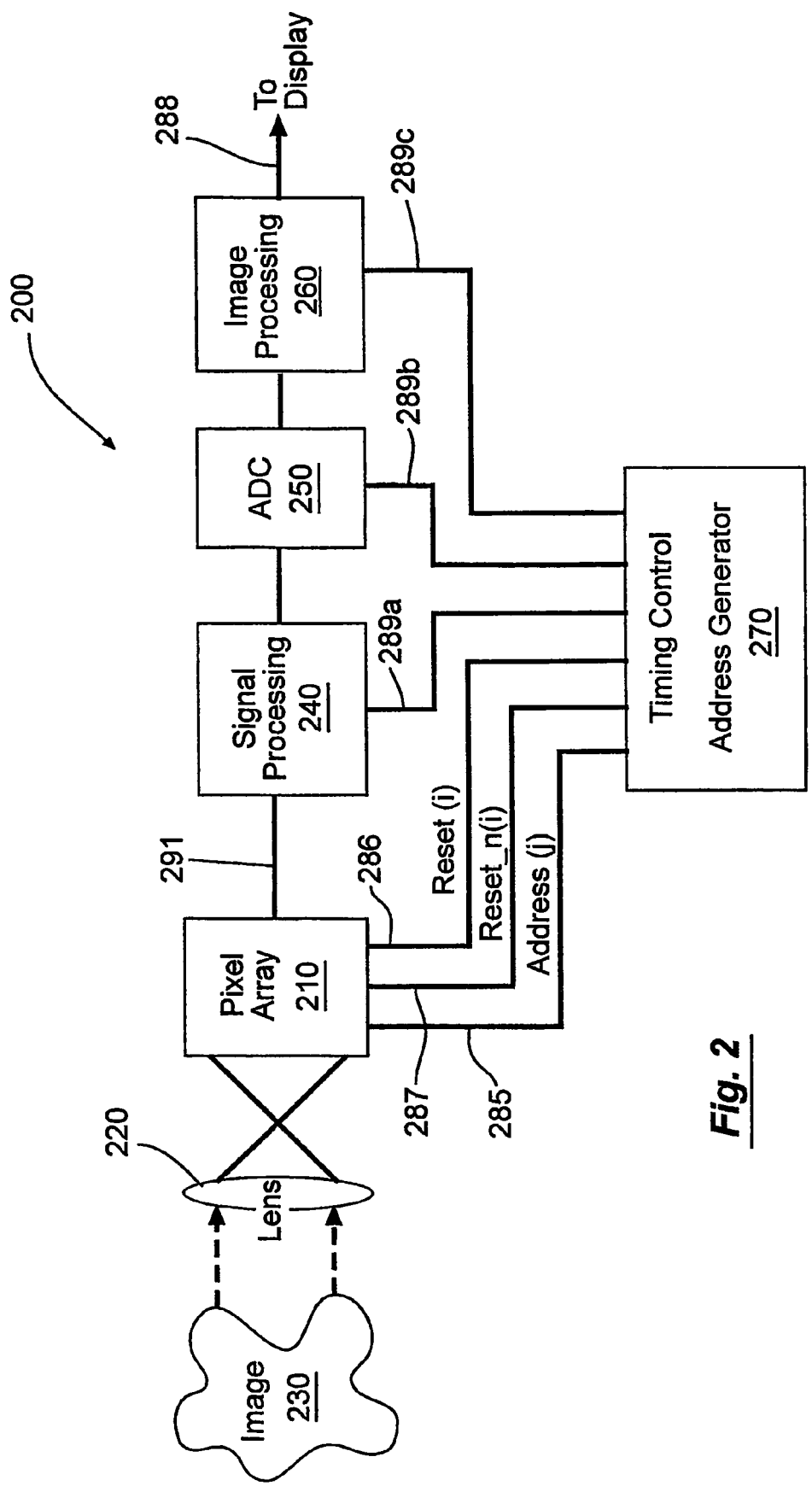
FIG. 2 is a block diagram of an image processing system in accordance with embodiments of the present invention.

Referring to FIG. 2, an imaging system 200 is illustrated. Imaging system 200 includes an optical device 220 for focusing light reflected from an image 230 onto a pixel array 210. Pixel array 210 provides one or more output signals 291 representative of image 230 as focussed on pixel array 210. Various signal processing functions can be performed by a signal processing block 240 on output signal(s) 291 to create a desired output form. Such processing functions can include level shifting, black level offset correction, and/or amplification.

The processed signals from signal processing block 240 can be passed to an analog to digital converter ("ADC") 250 where they are converted from the analog domain to the digital domain. From there, additional image processing can be performed by image processing block 260. Ultimately, the detected image is presented as an output 288 to a display, memory, or other image receptor.

The operation of imaging system 200 is controlled via a timing control and address generator ("TCAG") block 270. TCAG 270 provides signals 289 to control signal processing block 240, ADC 250, and image processing block 260. In addition, TCAG 270 provides a reset control signal 286, a charge evacuation control signal 287, and a selection control signal 285 to control pixel array 210. As will be described below in more detail, selection control signal 285 controls which pixel output(s) 291 from pixel array 210 are presented to signal processing block 240. Reset control signal 286 provides timing control related to resetting the various pixels within pixel array 210, and charge evacuation control signal 287 provides for dissipating noise causing charge accumulations within pixel array 210.

Figure 3:
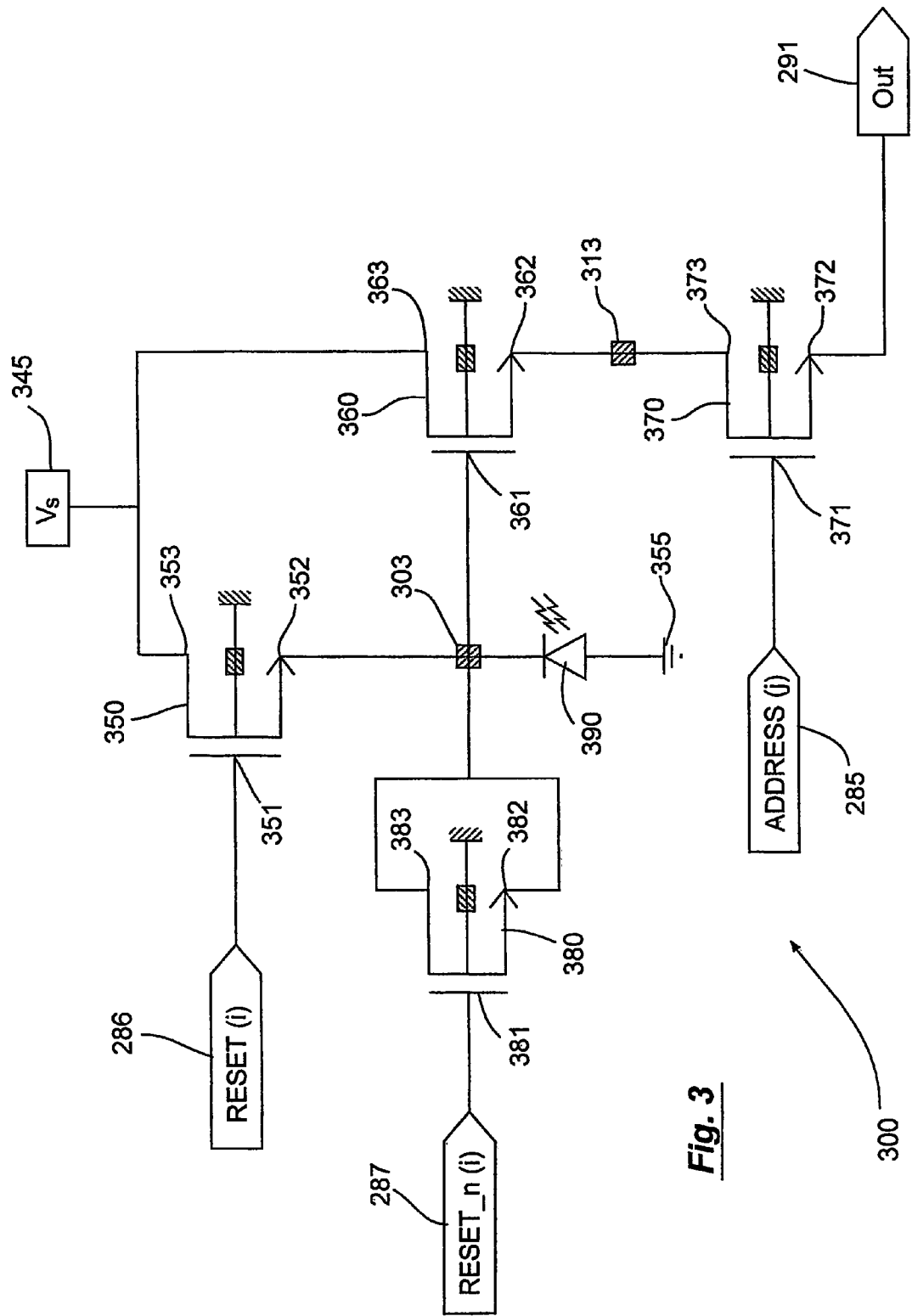
FIG. 3 is a schematic diagram of a pixel with charge evacuation capabilities in accordance with an embodiment of the present invention.

Referring to FIG. 3, a pixel 300 is illustrated in accordance with embodiments of the present invention. Pixel 300 includes a reset element 350, a source follower transistor 360, a selection element 370, a charge evacuation element 380, and a light sensitive element 390. As discussed in relation to FIG. 2, the inputs to pixel 300 include a reset control signal 286, a selection control signal 285, and a charge evacuation control signal 287. Further, pixel 300 provides output signal 291. In an embodiment, pixel 300 is attached to a voltage source 345 and a common ground 355.

Source follower transistor 360 can be any of a number of transistor types. In one particular embodiment, source follower transistor 360 is a CMOS FET. Source follower transistor 360 includes a source follower gate 361, a source follower source 362 and a source follower drain 363. Each of evacuation element 380, reset element 350, and photodiode 390 are electrically connected to source follower gate 361. For purposes of this document, charge evacuation element 380 can be any device capable of dissipating charge from pixel 300. Thus, for example, charge evacuation element 380 can be a switch, a FET, a bipolar junction transistor ("BJT"), a switched capacitor, or any other such device. In one particular embodiment of the present invention, charge evacuation element 380 is CMOS transistor as illustrated in FIG. 3. In some cases, such CMOS transistors can be comprised of N-FET devices, P-FET devices, and/or combinations thereof as known in the art. In such an embodiment, charge evacuation element 380 includes a charge evacuation gate 381, a charge evacuation drain 383, and a charge evacuation source 382.

As used herein, a reset element 350 can be any device capable of switching, such that voltage source 345 is applied to light sensitive element 390. In one particular embodiment, reset element 350 is a CMOS transistor that includes a reset gate 351, a reset drain 353, and a reset source 352. Yet further, for purposes of this document, light sensitive element 390 is any device that is capable of detecting the presence of light and producing a signal indicative of the amount of light detected. Thus, in one embodiment of the present invention, light sensitive element 390 is a photodiode. In other embodiments, light sensitive element 390 is a photo-gate. Other such light sensitive elements can be used including, but not limited to, a bipolar photo-transistor and/or a stacked comples n-p-n-p device where each junction is sensitive to a part of the light spectrum to be detected.

Also for purposes of this document, selection element 370 can be any device capable of presenting a signal representative of an amount of light impinging upon light sensitive element 390. Thus, selection element 370 can be a transistor, a pass gate, or the like. In one embodiment of the invention, selection element 370 is a CMOS transistor with a selection gate 371, a selection drain 373, and a selection source 372.

For discussion purposes, each of reset element 350, source follower transistor 360, selection element 370, and charge evacuation element 380 are CMOS transistors and light sensitive element 390 is a photodiode. However, based on the disclosure provided herein, one of ordinary skill in the art will recognize that the present invention and the principles included herewith are applicable to a number of other device types.

As illustrated by pixel 300, source follower drain 363 and reset drain 353 are both electrically coupled to voltage source 345. Further, source follower gate 361, a node of light sensitive element 390, reset source 352, charge evacuation source 382, and charge evacuation drain 383 are electrically coupled together at a node 303. The other node of light sensitive element 390 is electrically coupled to common ground 355. Yet further, source follower source 362 is electrically coupled to selection drain 373 at a node 313.

Reset gate 351 is driven by reset control signal 286, charge evacuation gate 381 is driven by charge evacuation control signal 287, and selection gate 371 is driven by selection control signal 285. Output signal 291 is driven by selection source 372. In some embodiments, charge evacuation control signal 287 is the inverse, or complement, of reset control signal 286. Thus, when reset element 350 is switched, thereby providing a low impedance path from reset drain 353 to reset source 352, charge evacuation element 380 is not switched, thereby providing an open circuit between charge evacuation drain 383 and charge evacuation source 382. The opposite is also true. When reset element 350 is not switched, thereby providing an open circuit between reset drain 353 and reset source 352, charge evacuation element 380 is switched thereby providing a low impedance path from charge evacuation drain 383 to charge evacuation source 382.

In some embodiments where charge evacuation control signal 287 is the complement of reset control signal 286, charge evacuation control signal 287 is delayed such that a falling edge of reset control signal 286 precedes a corresponding rising edge of charge evacuation control signal 287 by a period of time. In other embodiments, charge evacuation control signal 287 works in relation to reset control signal 286, but is not the complement of reset control signal 286, but rather a distinctly generated signal. The timing relationships of the various signals are discussed further in relation to FIG. 5 below.

Figure 4:
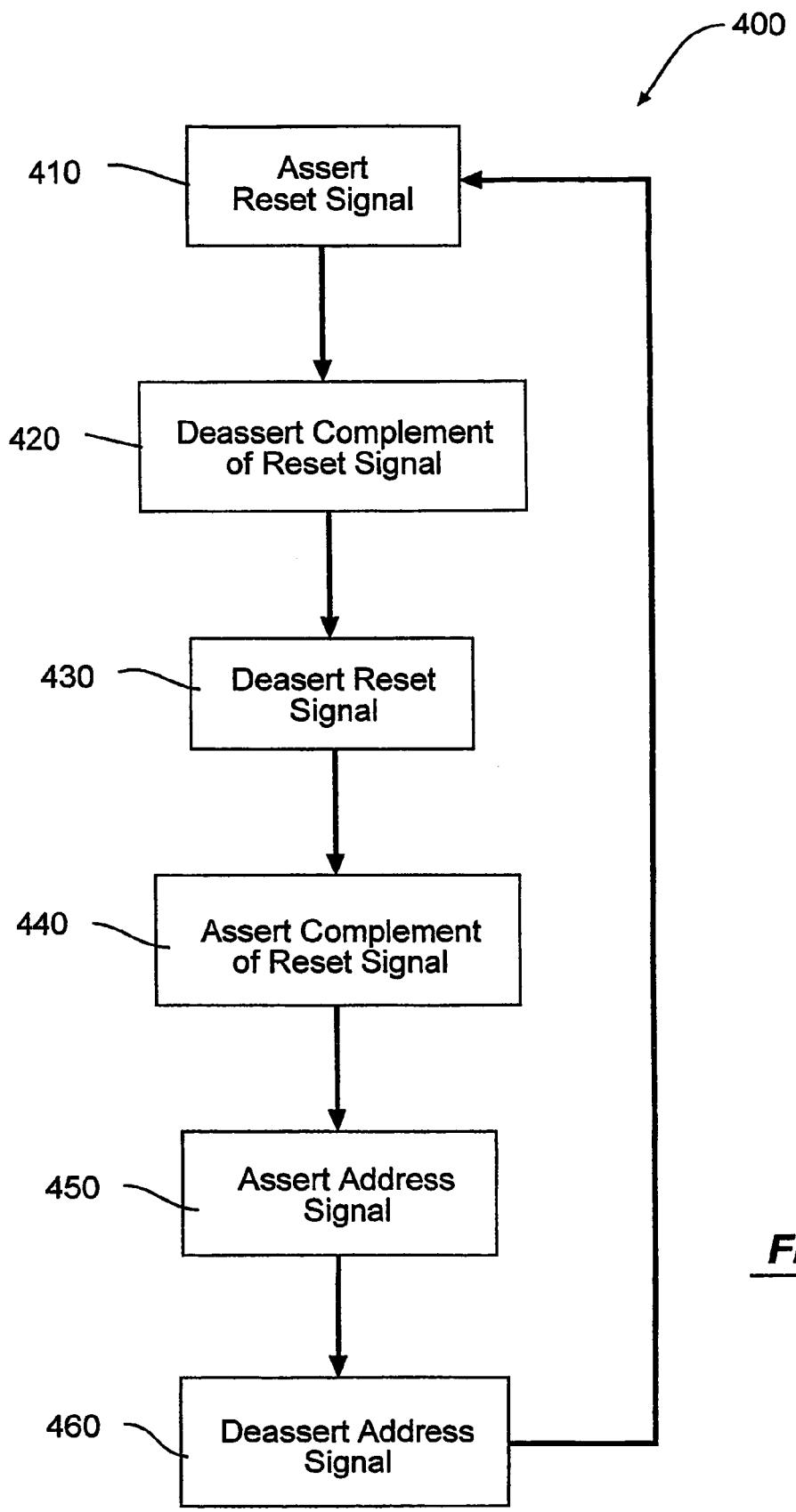
FIG. 4 is a flow diagram illustrating a method for operating the pixel of FIG. 3 in accordance with an embodiment of the present invention.

FIG. 4 illustrates a flow diagram 400 of one method in accordance with the present invention for operating pixel 300. In operation, reset control signal 286 is asserted such that a low impedance path exists between reset drain 353 and reset source 352 (block 410). In particular embodiments, reset control signal 286 overdrives reset gate 351 such that photodiode 390 is charged as rapidly as possible. Further, charge evacuation control signal 287 is deasserted such that an open circuit exists between charge evacuation drain 383 and charge evacuation source 382 (block 420). As such, a voltage corresponding to voltage source 345, less the impedance drop across reset element 350 is present at node 303, thereby reverse biasing photodiode 390. In this state, photodiode 390 is charged to a level corresponding to the voltage at node 303. Further, a negative charge is built in the channel of reset element 350.

Some time later, reset control signal 286 is deasserted such that an open circuit exists between reset drain 353 and reset source 352 (block 430). Thus, additional charge from voltage source 345 is not available to photodiode 390. However, on the falling edge of reset control signal 286, the negative charge accumulated in the channel of reset element 350 is dissipated through both reset drain 353 and reset source 352. Thus, part of the charge is discharged via node 303 causing a voltage drop (i.e., noise), which can be significant. In some cases, the voltage drop due to the negative charge from reset element 350 can be between two-hundred and five-hundred millivolts for geometries of four to seven micrometers, and is exacerbated as pixel geometries and source voltages decrease.

With an open circuit between reset drain 353 and reset source 352, the charge built up in photodiode 390 begins to dissipate at a rate corresponding to the amount of light impinging upon photodiode 390. Thus, where a significant amount of light impinges upon photodiode 390, the voltage at node 303 will decrease at a more rapid rate than if a small amount of light impinges upon photodiode 390.

Either some time after the deassertion of reset control signal 286 or coincident therewith, charge evacuation control 287 is asserted such that a low impedance path exists between charge evacuation drain 383 and charge evacuation source 352 (block 440). This assertion provides a path whereby at least a portion of the negative charge that was stored in the channel of reset element 350 can dissipate through charge evacuation device 380. In some embodiments, the type of device used to implement charge evacuation element 380 is chosen such that the operation of charge evacuation element 380 reflects the non-linearities exhibited by reset element 350. Thus, in some cases, charge evacuation element 350 and reset element 350 are chosen to be the same device types.

As approximately half of the charge built up in the channel of reset element 350 dissipates through reset drain 353 and the other half dissipates through reset source 352, the size of charge evacuation device 380 can be chosen such that it can evacuate roughly half of the charge built up in the channel of reset element 350. Thus, in one embodiment, where the charge evacuation element 380 and reset element 350 are the same device type, the size of charge evacuation device 380 is roughly half the size of reset element 350. In other embodiments where reset element 350 and charge evacuation element 380 are different device types, such as, when charge evacuation element 380 is a switched capacitor, the size of the capacitor is chosen based on the amount of charge to be dissipated from the channel of reset element 350 via reset source 352. As illustrated below in FIG. 5, dissipation of the negative charge in the channel of reset element 350 through charge evacuation element 380 can, depending upon the geometry of pixel 300, eliminate as much as five-hundred millivolts of noise at node 303. Elimination of such noise at node 303 assures that the signal sampled at output 291 more accurately reflects the amount of light detected at photodiode 390.

At some point, selection control signal 285 is asserted to sample the remaining voltage at node 303, and thereby gain an approximation of the light impinging upon photodiode 390 (block 450). With selection control signal 285 asserted, a low impedance path exists from selection drain 373 to selection source 372. Thus, a signal representative of the voltage present at node 303 is presented on output 291 via source follower transistor 360. Once the output is sampled, selection control signal 285 is deasserted (block 460) and the process is repeated to detect the amount of light impinging upon photodiode 390 at a future point in time. It should be recognized from FIG. 5 that in some embodiments of the present invention, the assertion of selection control signal 285 overlaps the assertion of reset control signal 286. Yet, in other embodiments, the assertion of selection control signal 285 does not overlap the assertion of reset control signal 286.

FIGS. 5 illustrate timing diagrams of the various signals related to the operation of pixel 300. More particularly, the figures illustrate the relationship between reset control signal 286, charge evacuation control signal 287, selection control signal 285, the voltage at node 303, and the voltage at output 291.

Figure 5A:
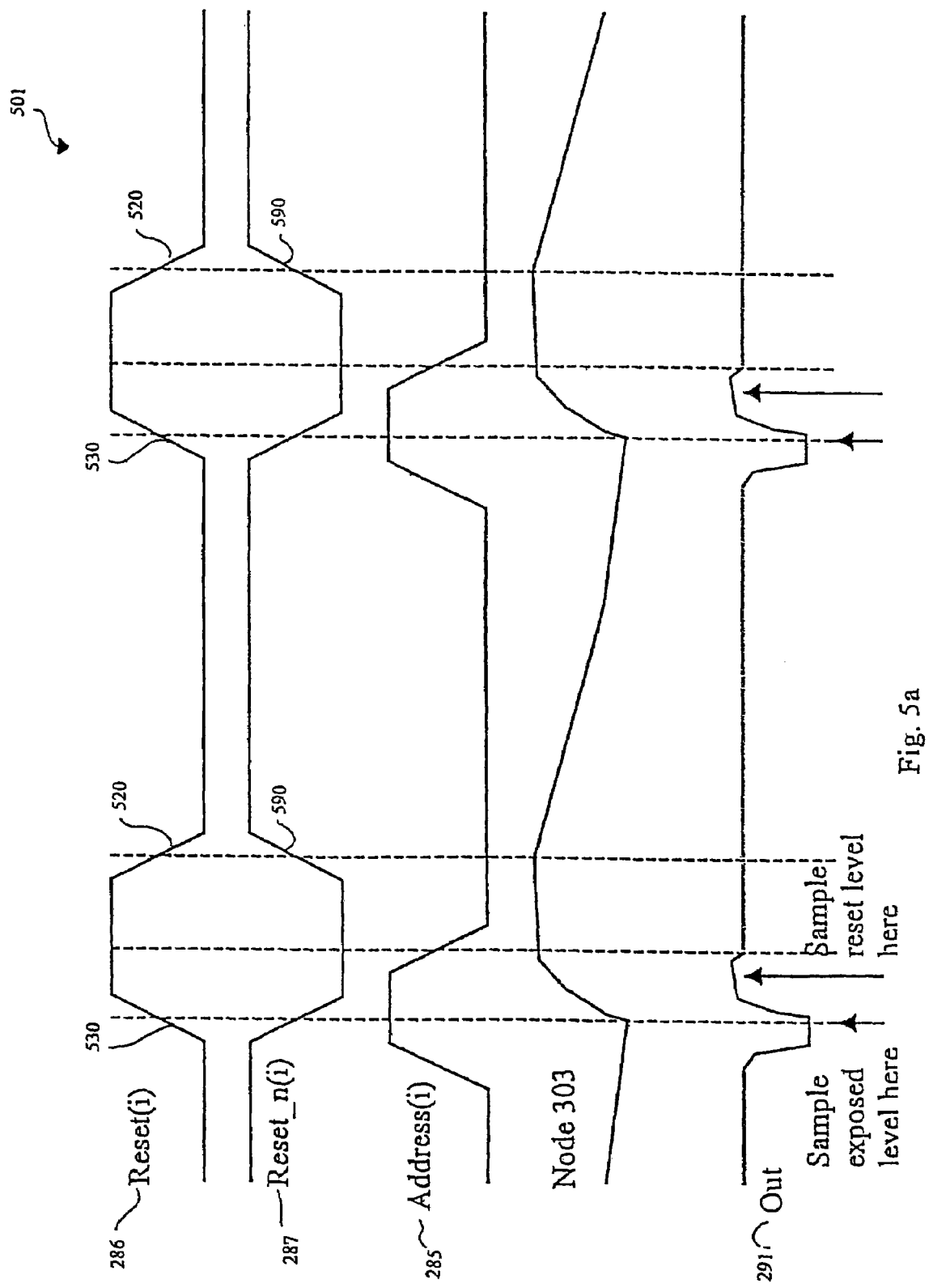
FIG. 5 are timing diagrams illustrating various interrelationships between control signals provided to the pixel of FIG. 3 and outputs therefrom.
Figure 5B:
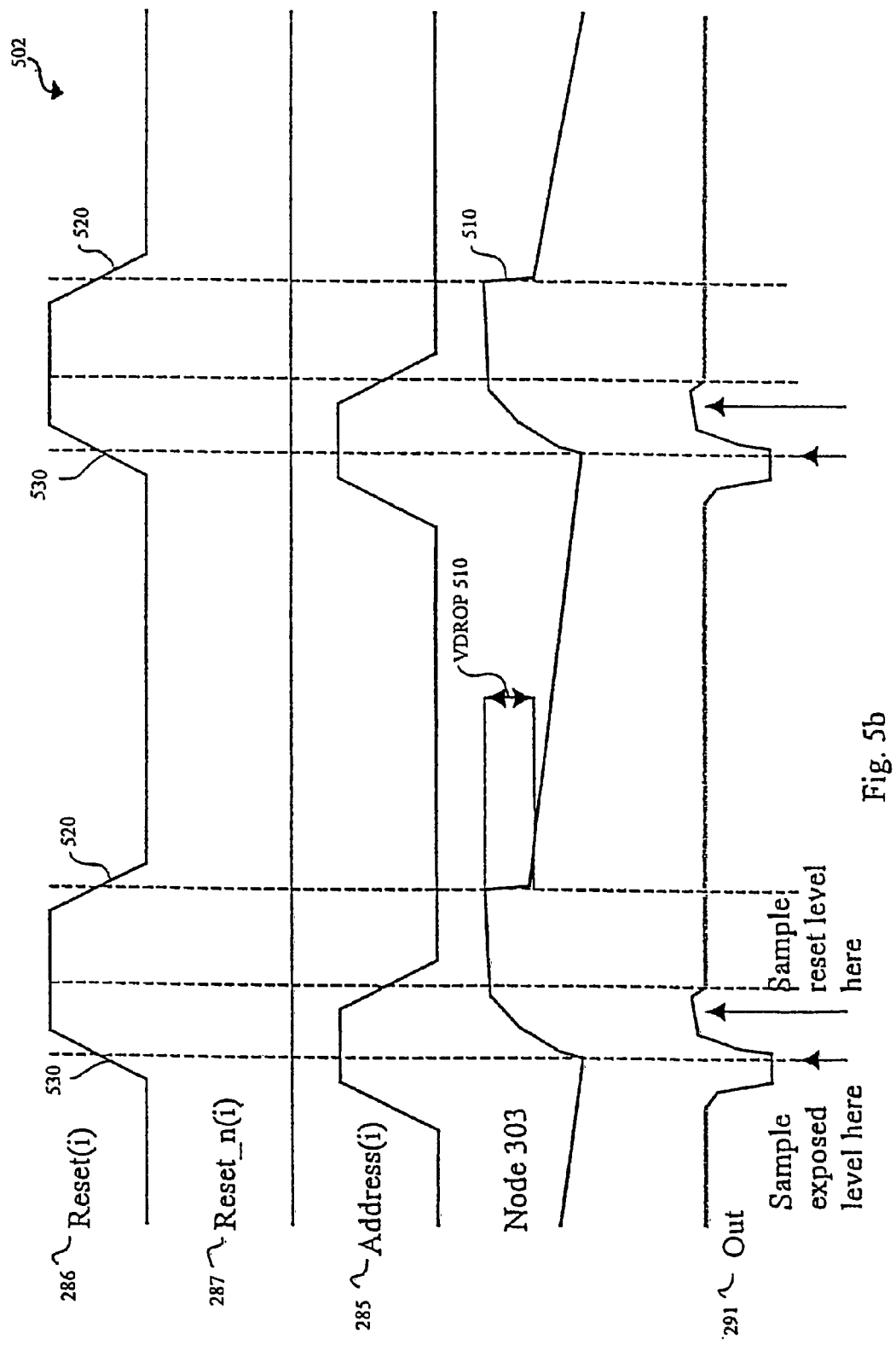

FIG. 5a is a timing diagram 501 illustrating operation of pixel 300 where reset control signal 286 and charge evacuation control signal 287 are complementary, and where charge evacuation element 380 is operational. In contrast, FIG. 5b is a timing diagram 502 illustrating similar operation of pixel 300 where charge evacuation element 380 is not present. As illustrated in FIG. 5b, at the falling edge of reset control signal 286 (noted as 520), a voltage drop, VDROP 510, is exhibited at node 303. This voltage drop exists until photodiode 390 is again charged by assertion of reset control signal 286 (noted as 530). This voltage reduction at node 303 (i.e., noise) causes a corresponding reduction in output signal 291. This is in comparison to timing diagram 501 of FIG. 5a, where the voltage drop at node 303 does not occur because the charge causing the voltage drop in timing diagram 502 is evacuated through charge evacuation element 380 as previously described. Thus, as illustrated in the contrast between FIG. 5a and FIG. 5b, a substantial amount of noise can be eliminated from node 303 via the operation of charge evacuation element 380.

Figure 5C:
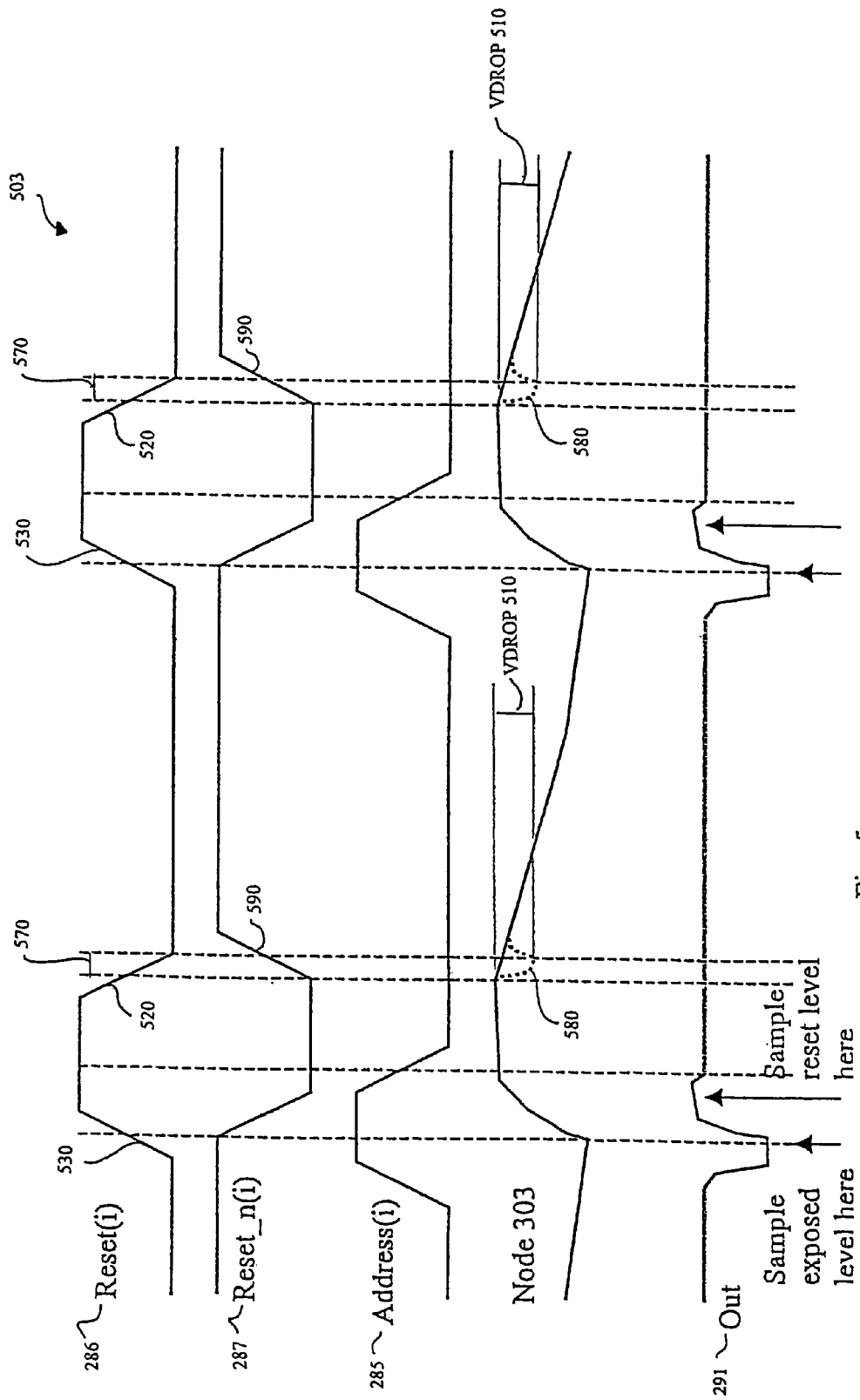

FIG. 5c is a timing diagram 503 that illustrates another embodiment where, similar to timing diagram 501, reset control signal 286 and charge evacuation control signal 287 are complementary. However, in contrast to timing diagram 501, timing diagram 503 illustrates charge evacuation control 287 delayed from reset control 286 by a period 570. As illustrated, charge evacuation element 380 still dissipates the charge from the channel of reset element 350, albeit at a slightly later time corresponding to the assertion of charge evacuation control 287. Thus, a voltage droop 580 corresponding to VDROP 510 (illustrated as a dotted line) is noted on node 303, until the assertion of charge evacuation control signal 287 (noted as 590). However, because of the operation of charge evacuation element 380, the voltage at node 303 is corrected before the sample is taken upon assertion of selection control signal 285.

Based on the disclosure provided herein, one of ordinary skill in the art will recognize a number of other timing relationships between the various signals that each dissipate the charge within the channel of reset element 350, thus reducing the noise manifest at output 291. Further, as previously mentioned, reset control signal 286 and charge evacuation control signal 287 can be separately generated to achieve a timing relationship that allows for charging of photodiode 390, and for dissipating the charge within the channel of reset element 350. In some cases, it can minimize the logic in TCAG 270 to have charge evacuation control 287 be the complement of reset control 286. Further, it should be recognized that selection control signal 285 can be generated at other times than those illustrated in FIG. 5.

The invention has now been described in detail for purposes of clarity and understanding. However, it will be appreciated that certain changes and modifications may be practiced within the scope of the appended claims. For example, charge evacuation element 380 can be a switched capacitor and/or light sensitive element 390 can be a photogate or other such device. Yet further, it should be recognized that the pixel, such as that illustrated in FIG. 3, can include elements intervening between various of the elements as illustrated. For example, a capacitor may be connected between the drain of reset element 350 and the gate of source follower transistor 360. Thus, as an example, reset source 352 is discussed as being electrically coupled to source follower gate 361 to indicate the possibility of such an intervening element(s).

Accordingly, it should be recognized that many other systems, functions, methods, and combinations thereof are possible in accordance with the present invention. Thus, although the invention is described with reference to specific embodiments and figures thereof, the embodiments and figures are merely illustrative, and not limiting of the invention. Rather, the scope of the invention is to be determined solely by the appended claims.

What is claimed is:

1. A MOS pixel, the pixel comprising:
a reset transistor, wherein the reset transistor includes a reset drain and a reset gate;
a charge evacuation element, wherein a node of the charge evacuation element is electrically coupled to the reset source; and
wherein:
the charge evacuation element is operable to evacuate charge accumulated in a channel of the reset transistor, and
the charge evacuation element is active, at least partially, coextensive in time with the reset transistor.

2. The pixel of claim 1, the pixel further comprising:
a light sensitive element, wherein a node of the light sensitive element is electrically coupled to the reset source.

3. The pixel of claim 1, wherein the reset transistor is CMOS transistor.

4. The pixel of claim 1, wherein the charge evacuation element is a MOS transistor, and wherein the MOS transistor includes a charge evacuation source and a charge evacuation drain.

5. The pixel of claim 4, wherein the node of the charge evacuation element is electrically coupled to both the charge evacuation source and the charge evacuation drain.

6. The pixel of claim 2, the pixel further comprising:
a source follower transistor, wherein the source follower transistor includes a source follower gate and a source follower drain, and wherein the source follower gate is electrically coupled to the reset source;
a selection transistor, wherein the selection transistor includes a selection drain, a selection transistor gate, and a selection drain, and wherein the selection transistor source is electrically coupled to the source follower source; and
a selection signal, wherein assertion of the selection signal causes a representation of a signal from the node of the light sensitive element to be present on an output of the pixel.

7. The pixel of claim 6, wherein the light sensitive element is a photodiode.

8. The pixel of claim 2, wherein the charge evacuation element is a MOS transistor, and wherein the MOS transistor includes a charge evacuation source, a charge evacuation drain, and a charge evacuation gate, and wherein the node of the charge evacuation element is electrically coupled to both the charge evacuation source and the charge evacuation drain, the pixel further comprising:
a reset signal driving the reset gate; and
a complement of the reset signal driving the charge evacuation gate.

9. The pixel of claim 8, wherein the complement of the reset signal is delayed from the reset signal.

10. The pixel of claim 1, the pixel further comprising:
a source follower transistor, wherein the source follower transistor includes a source follower gate and a source follower drain;
a selection transistor, wherein the selection transistor includes a selection transistor source, a selection transistor gate, and a selection drain, and wherein the selection transistor source is electrically coupled to the source follower drain.

11. The pixel of claim 2, wherein the light sensitive element is a photodiode.

12. The pixel of claim 1, wherein the charge evacuation element is a charge evacuation transistor including a charge evacuation source and a charge evacuation drain, both the charge evacuation source and the charge evacuation drain being electrically coupled to the reset source, and wherein the charge evacuation transistor is approximately one-half the size of the reset transistor.

13. A circuit, the circuit comprising:
a reset transistor, wherein the reset transistor includes a reset gate and a reset drain;
a photodiode, wherein a node of the photodiode is electrically coupled to the reset source;
a charge evacuation transistor, wherein the charge evacuation transistor includes a charge evacuation gate, a charge evacuation drain, and a charge evacuation source, and wherein the charge evacuation source and the charge evacuation drain are both electrically coupled to the reset source; and
wherein the charge evacuation transistor is operable to evacuate charge accumulated in a channel of the reset transistor.

14. The circuit of claim 13, the circuit further comprising:
a source follower transistor, wherein the source follower transistor includes a source follower gate and a source follower drain, and wherein the source follower gate is electrically coupled to the reset source;
a selection transistor, wherein the selection transistor includes a selection source, a selection gate, and a selection drain, and wherein the selection drain is electrically coupled to the source follower source.

15. The circuit of claim 14, the circuit further comprising:
a selection signal, wherein assertion of the selection signal causes a representation of a signal from the node of the photodiode to be present on an output of the pixel.

16. The circuit of claim 13, the circuit further comprising:
a reset signal driving the reset gate; and
a charge evacuation signal driving the charge evacuation gate.

17. An imaging system, the imaging system comprising:
a group of pixel elements, wherein:
one or more of the pixel elements include a reset element, a charge evacuation element, a light sensitive element, a source follower transistor including a source follower gate, and a selection element, and
the charge evacuation element is active, at least partially, coextensive in time with the reset element;
an optical device, wherein the optical device transfers light to the group of pixel elements, and wherein the light strikes the light sensitive element of the pixel elements; and
a timing circuit, wherein the timing circuit provides at least one control signal to the group of pixel elements.

18. The imaging system of claim 17, wherein the reset element is a transistor including a reset gate and a reset drain, the reset drain being electrically coupled to the source follower gate, and wherein the charge evacuation element is operable to evacuate a charge accumulated in a channel of the reset transistor.

19. The imaging system of claim 18, wherein:
the source follower transistor further includes a source follower drain;
the selection element is a selection transistor including a selection source and a selection gate, wherein the selection source is electrically coupled to the source follower drain;
the charge evacuation element is a charge evacuation transistor including a charge evacuation gate, a charge evacuation source, and a charge evacuation drain, wherein both the charge evacuation source and the charge evacuation drain are electrically coupled to the source follower gate; and the light sensitive element is a photodiode, wherein a node of the photodiode is electrically coupled to the source follower gate.

20. The imaging system of claim 19, wherein at least one of the source follower transistor, the reset transistor, the charge evacuation transistor, and the selection transistor are CMOS devices.

21. The imaging system of claim 19, wherein the at least one control signal comprises a selection signal electrically coupled to the selection gate.

22. The imaging system of claim 19, wherein the at least one control signal comprises a reset signal electrically coupled to the reset gate, and a complement of the reset signal is electrically coupled to the charge evacuation gate.

23. The imaging system of claim 17, wherein the group of pixel elements are arranged in a rectangular array.

24. An image sensor, the image sensor comprising:
a plurality of pixel devices, wherein the plurality of pixel devices are arranged as a plurality of rows and a plurality of columns; and
wherein each of the plurality of pixel devices includes:
a reset element with at least one node;
a light detecting element, wherein a node of the light detecting element is electrically coupled to the node of the reset element; and
a charge evacuation element, wherein:
a node of the charge evacuation element is electrically coupled to the node of the reset element, and
the charge evacuation element is active, at least partially, coextensive in time with the reset element.

25. A method for detecting an image, the method comprising:
providing a pixel device, wherein the pixel device includes:
a source follower transistor including a source follower gate and a source follower drain;
a photodiode, wherein a node of the photodiode is electrically coupled to the source follower gate;
a reset transistor including a reset gate and a reset drain, wherein the reset source is electrically coupled to the source follower gate;
a charge evacuation transistor including a charge evacuation source, a charge evacuation drain, and a charge evacuation gate, wherein both the charge evacuation source and the charge evacuation drain are electrically coupled to the source follower gate; and
applying a charge evacuation signal to the charge evacuation gate, wherein a charge accumulation in a channel of the reset transistor is reduced.

26. The method of claim 25, the method further comprising:
applying a complement of the charge evacuation signal to the reset gate, wherein a charge accumulation occurs at the node of the photodiode.

27. The method of claim 26, the method further comprising:
providing a selection transistor including a selection gate, a selection source, and a selection drain, wherein the selection drain is electrically coupled to the source follower source; and
applying a selection signal to the selection gate, wherein the source follower drain is presented with a signal representative of the charge accumulated at the node of the photodiode.

28. A method for reducing noise in a pixel device, the method comprising:
providing a charge evacuation element and a reset element within a pixel device;
activating the reset element; and
activating the charge evacuating element such that a charge within the pixel device is dissipated via the charge evacuation element, wherein:
the charge evacuating element comprises three terminals, and
two terminals of the charge evacuation element are coupled to the reset element.

* * * * *